US011259425B2

(12) United States Patent
Kim

(10) Patent No.: US 11,259,425 B2
(45) Date of Patent: Feb. 22, 2022

(54) DISPLAY INSTALLATION APPARATUS AND MULTI-DISPLAY HAVING THE SAME

(71) Applicant: LG Display Co., Ltd., Seoul (KR)

(72) Inventor: Ducksu Kim, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 108 days.

(21) Appl. No.: 16/721,492

(22) Filed: Dec. 19, 2019

(65) Prior Publication Data
US 2020/0205305 A1 Jun. 25, 2020

(30) Foreign Application Priority Data

Dec. 19, 2018 (KR) .................. 10-2018-0165444

(51) Int. Cl.
H05K 5/00 (2006.01)
H05K 5/02 (2006.01)
F16M 13/02 (2006.01)
F16M 11/24 (2006.01)

(52) U.S. Cl.
CPC .......... *H05K 5/0217* (2013.01); *F16M 11/24* (2013.01); *F16M 13/022* (2013.01); *H05K 5/0017* (2013.01); *H05K 5/0021* (2013.01); *F16M 2200/027* (2013.01)

(58) Field of Classification Search
None
See application file for complete search history.

(56) References Cited

U.S. PATENT DOCUMENTS

| 10,228,727 | B1* | 3/2019 | Pickett | A45F 5/00 |
| 2004/0056161 | A1* | 3/2004 | Ishizaki | F16C 11/106 248/176.3 |
| 2005/0224682 | A1* | 10/2005 | Ishizaki | F16C 11/106 248/455 |
| 2007/0000849 | A1* | 1/2007 | Lutz | G09F 9/33 211/26 |
| 2009/0225506 | A1* | 9/2009 | Lee | H05K 5/0017 361/679.21 |
| 2011/0101185 | A1* | 5/2011 | Kitaguchi | F16M 11/048 248/222.14 |
| 2011/0248129 | A1* | 10/2011 | Park | F16M 11/2014 248/205.1 |

(Continued)

FOREIGN PATENT DOCUMENTS

CN 203686493 U 7/2014

*Primary Examiner* — Anthony Q Edwards
*Assistant Examiner* — Rashen E Morrison
(74) *Attorney, Agent, or Firm* — Birch, Stewart, Kolasch & Birch, LLP

(57) ABSTRACT

A display installation apparatus and a multi-display including the same are discussed. The display installation apparatus can include a first position setting part inserted into a guide rail to be slidably moved in a first direction, and selectively fixed in a first position in the first direction; a second position setting part positioned at the first position setting part to be slidably moved in a second direction, and selectively fixed in a second position in the second direction; a third position setting part positioned at the second position setting part to be moved in a third direction, and selectively fixed in a third position in the third direction; and a fastening part provided in a display and detachably attached to the third position setting part to install the display into the display installation apparatus.

21 Claims, 10 Drawing Sheets

(56) References Cited

U.S. PATENT DOCUMENTS

| | | | | |
|---|---|---|---|---|
| 2012/0224311 A1* | 9/2012 | Sutherland | ......... | G06K 9/00335 |
| | | | | 361/679.01 |
| 2012/0247030 A1* | 10/2012 | Magpuri | .................. | E04H 3/22 |
| | | | | 52/6 |
| 2014/0235362 A1* | 8/2014 | Fox | ...................... | E04B 1/3211 |
| | | | | 472/75 |
| 2014/0263890 A1* | 9/2014 | McCarthy | .............. | F16M 11/24 |
| | | | | 248/205.1 |
| 2015/0282618 A1* | 10/2015 | Oya | ...................... | F16M 11/18 |
| | | | | 211/26 |
| 2016/0165196 A1* | 6/2016 | Gocke | ................... | G03B 21/58 |
| | | | | 352/43 |
| 2017/0114944 A1* | 4/2017 | Ho | .................... | F16M 11/2014 |
| 2020/0125031 A1* | 4/2020 | Weston | ................. | G02B 27/18 |

\* cited by examiner

[FIG. 1]
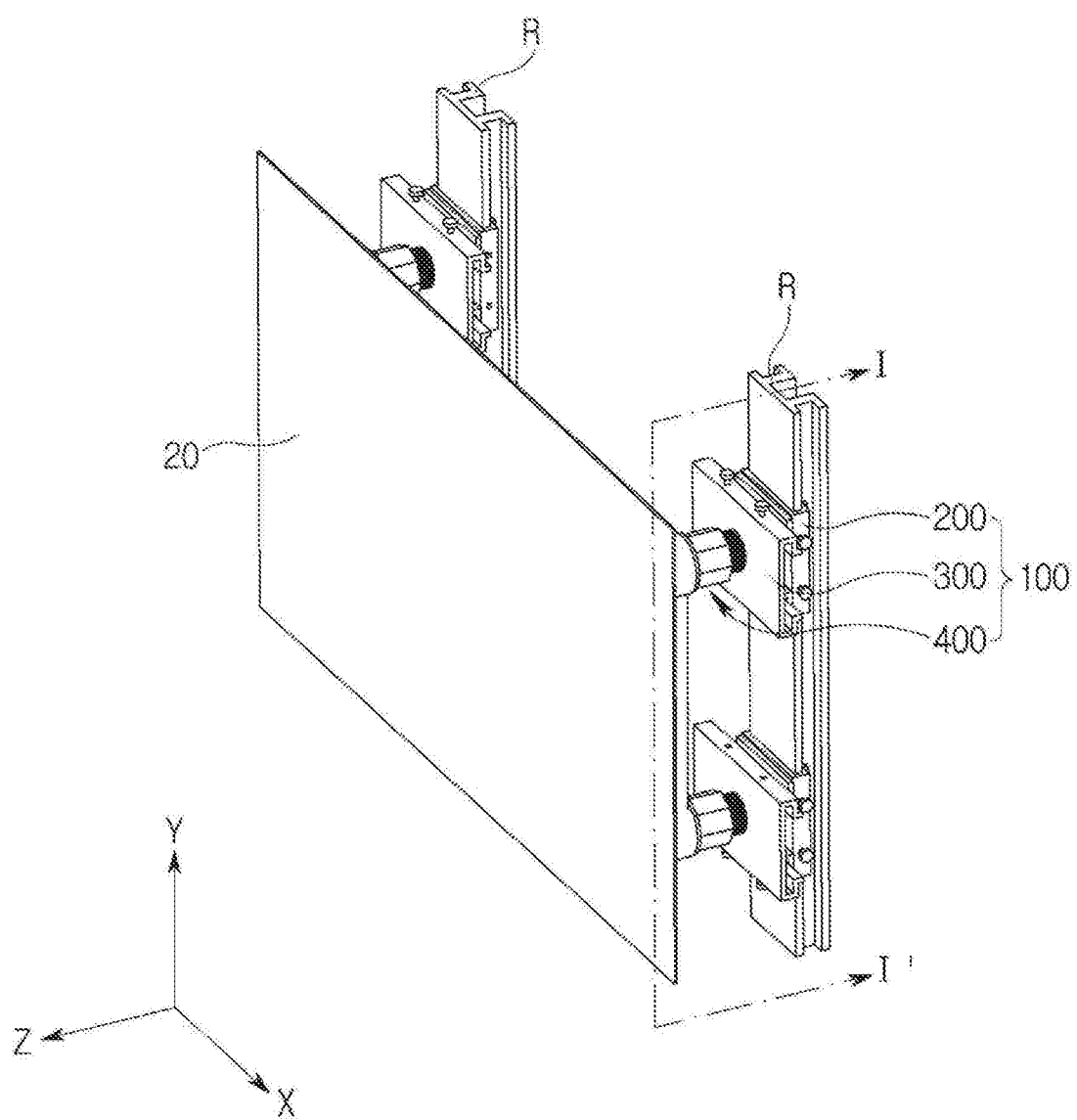

[FIG. 2]
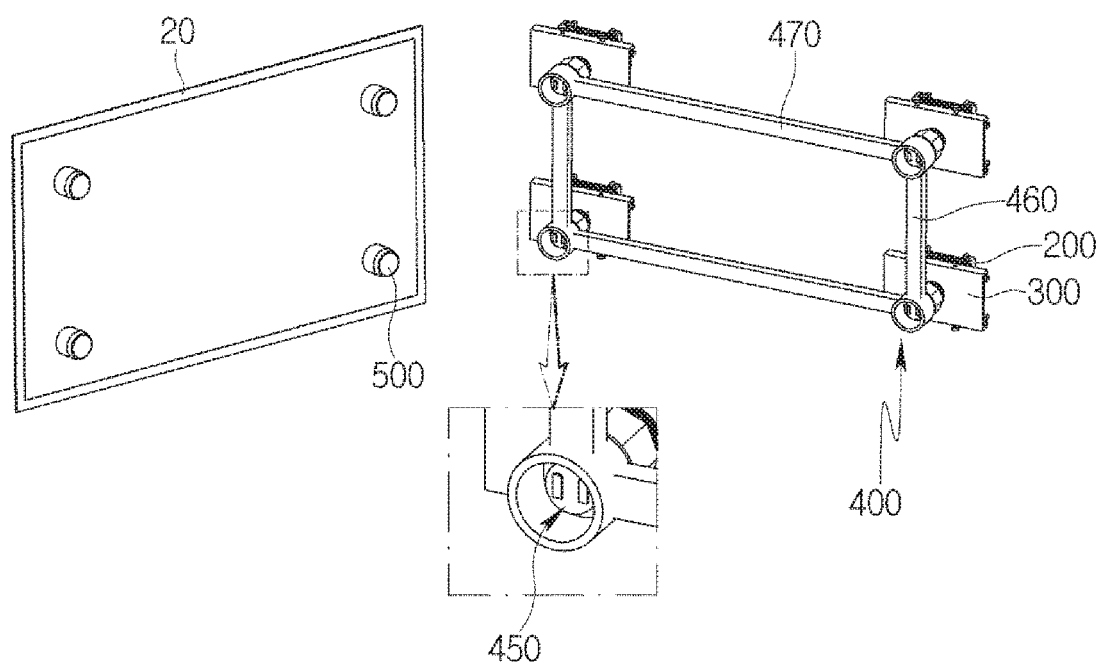

[FIG. 3]
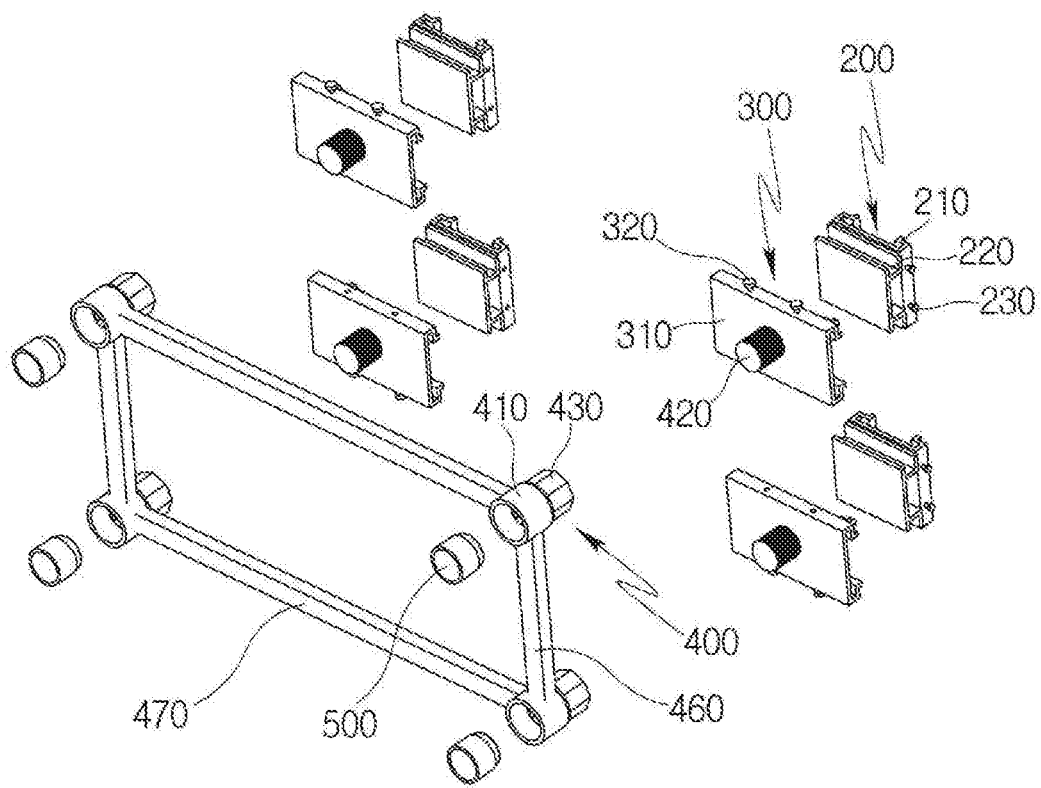

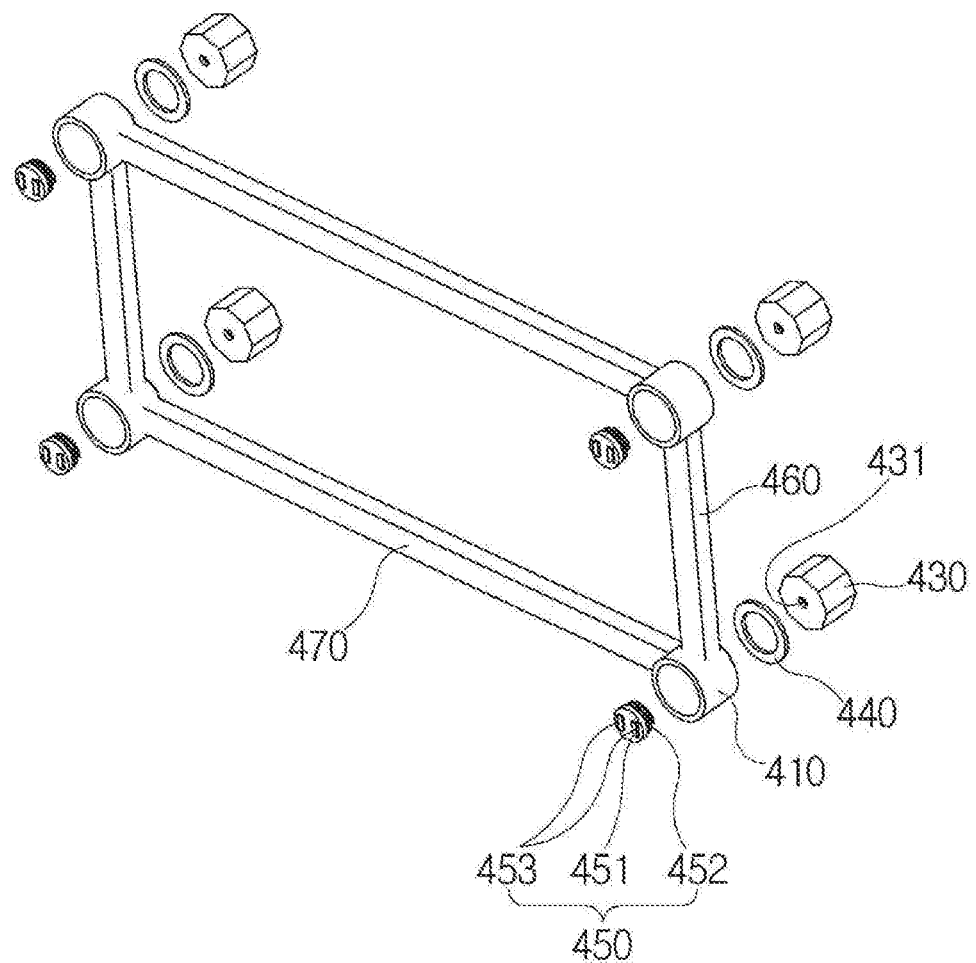
[FIG. 4]

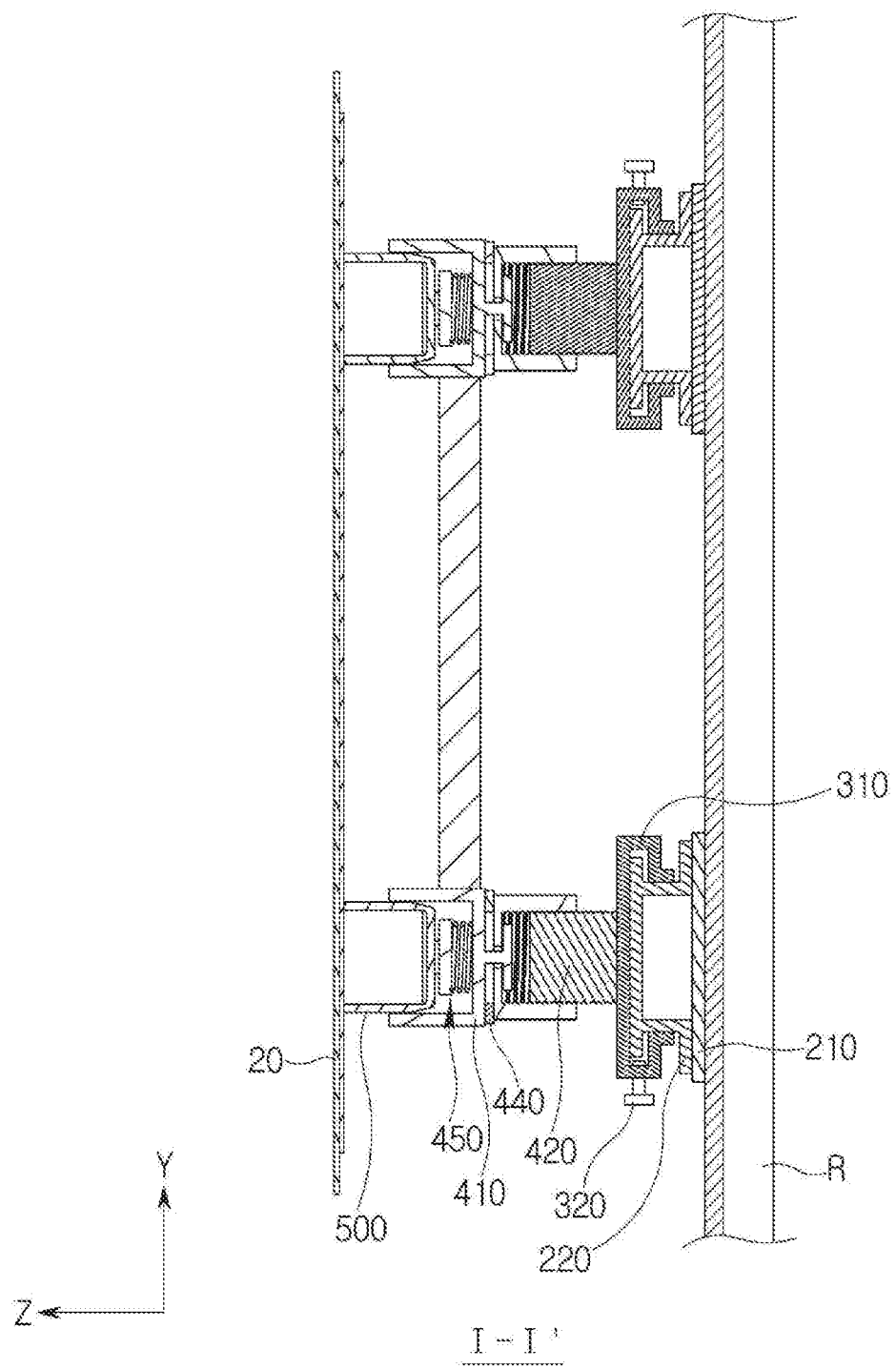

[FIG. 6A]
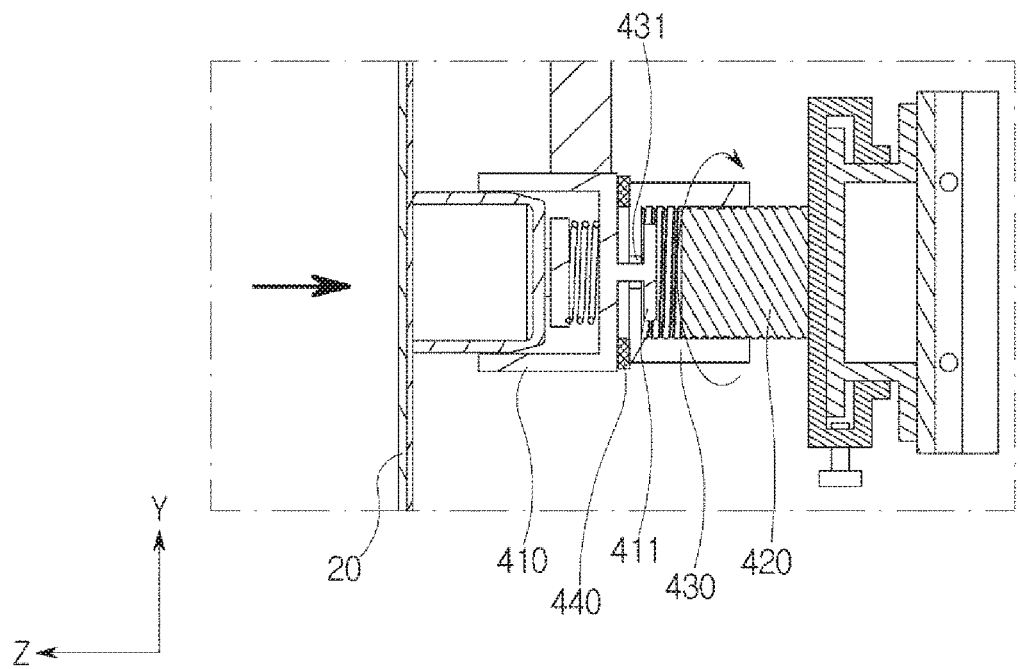
[FIG. 6B]
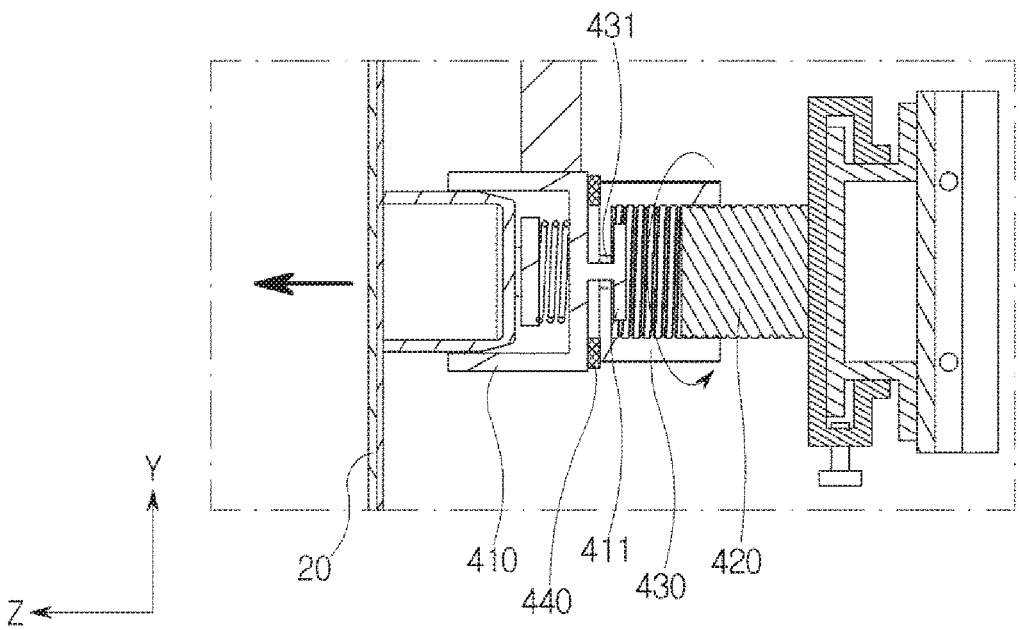

[FIG. 7A]
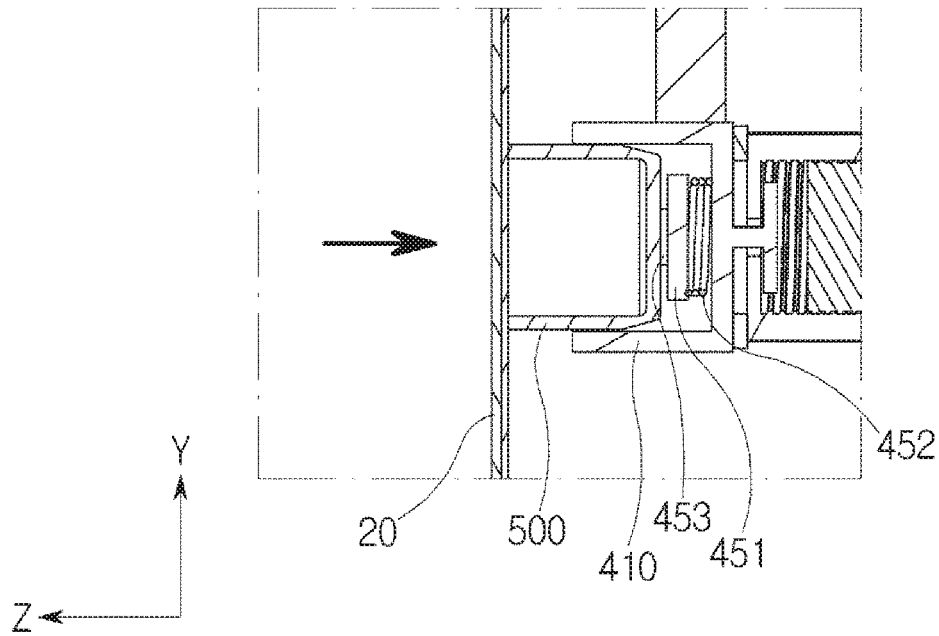
[FIG. 7B]
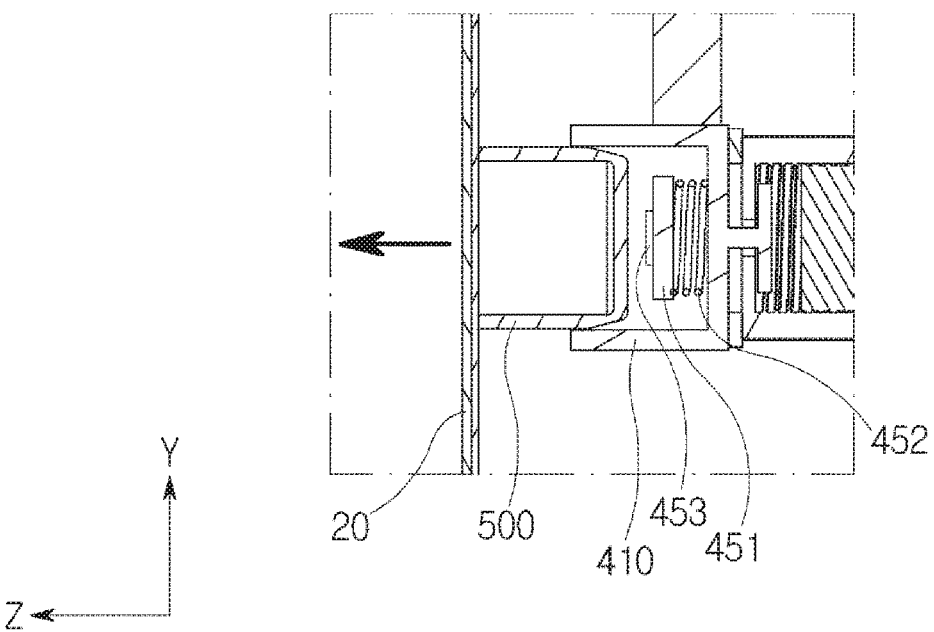

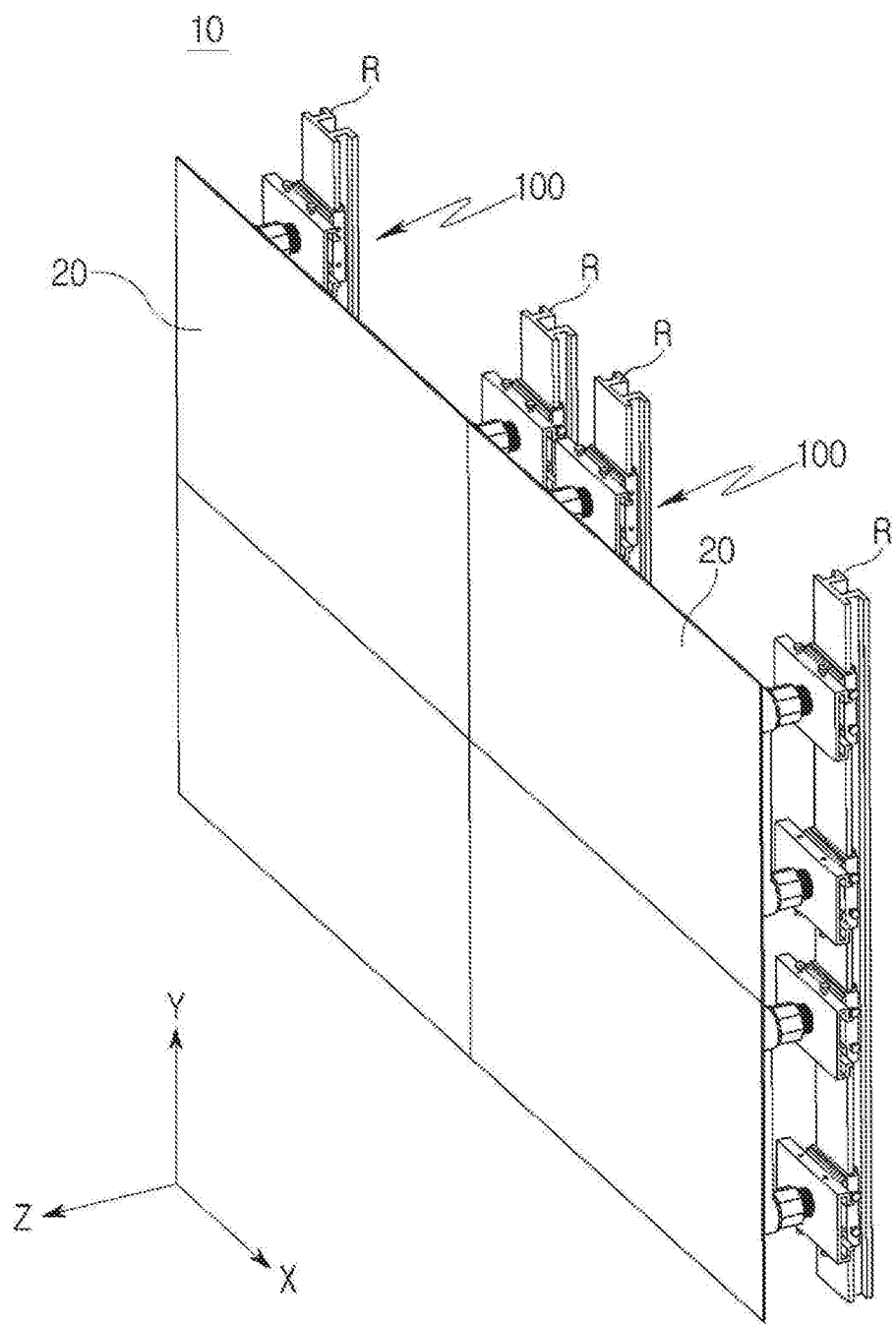
[FIG. 8]

[FIG. 9]
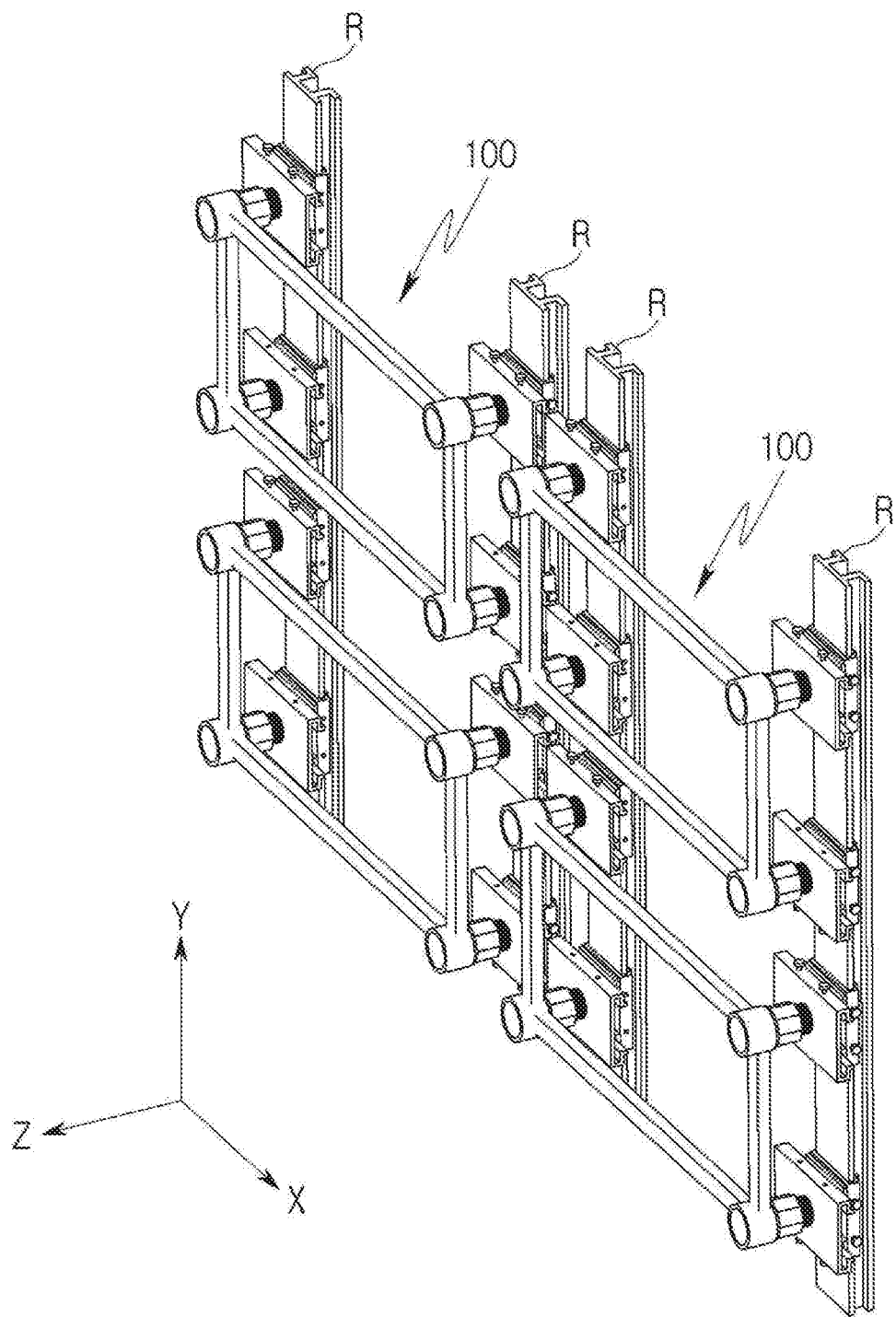

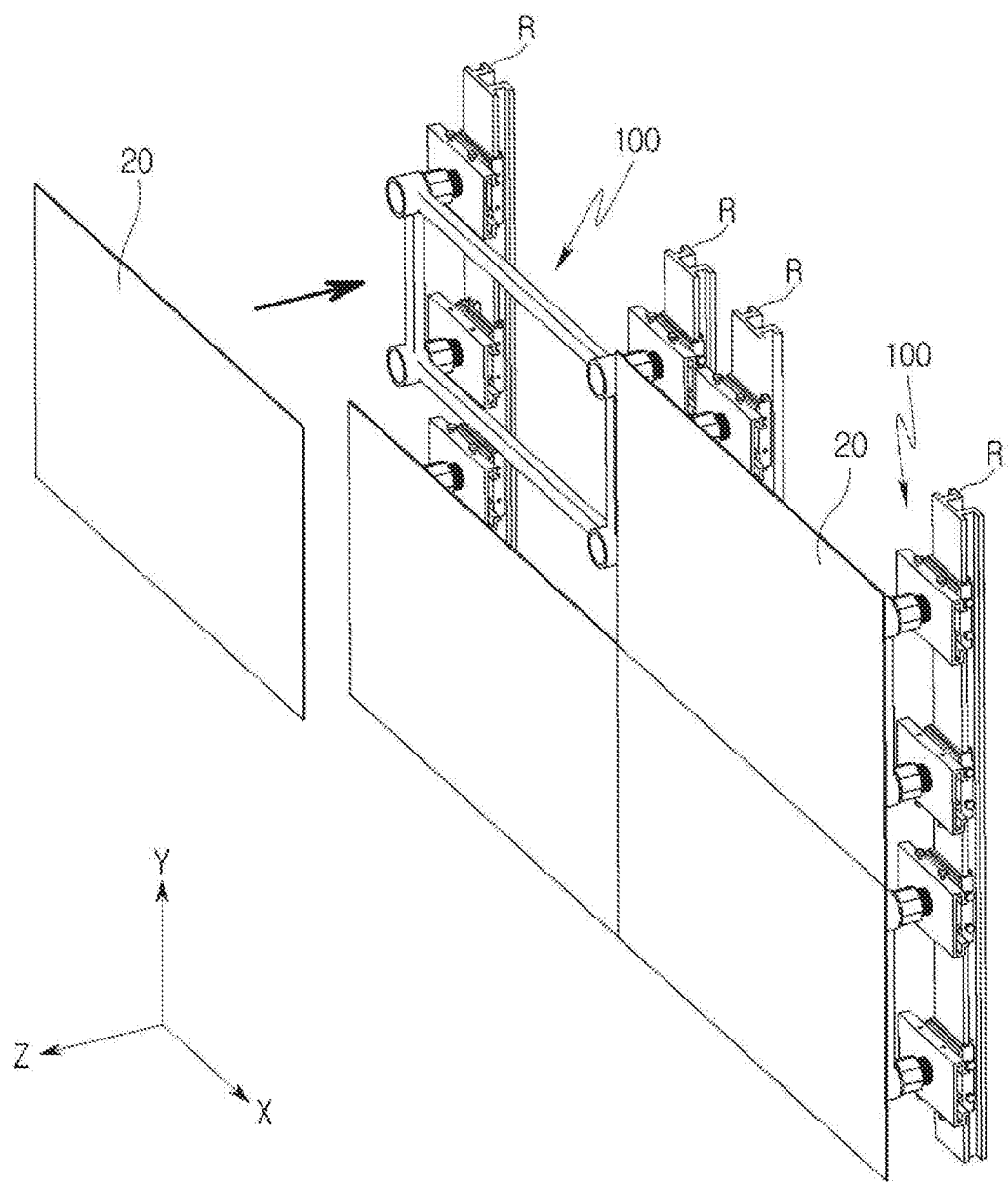
[FIG. 10]

DISPLAY INSTALLATION APPARATUS AND MULTI-DISPLAY HAVING THE SAME

CROSS-REFERENCE TO RELATED APPLICATIONS

This application claims priority benefit to the Korean Patent Application No. 10-2018-0165444 filed on Dec. 19, 2018 in the Republic of Korea, the disclosure of which is incorporated herein by reference in its entirety into the present application.

BACKGROUND OF THE DISCLOSURE

Field of the Disclosure

The present disclosure relates to a display installation apparatus and a multi-display including the same, and more particularly, to a display installation apparatus and a multi-display including the same, which are prepared so that a plurality of displays can be easily arranged to have a tile form.

Description of the Related Art

When a display device is installed in a public place where many people are crowded or a public facility where many people use, a large-sized display device is needed due to the characteristics of the installed place. Although a multi-display device is composed of a plurality of displays, the multi-display device is driven as if an image is displayed on one screen, such that the multi-display device can effectively provide image information to many people in the public place.

Meanwhile, generally, the multi-display device can be implemented by arranging a plurality of display modules in a tile form. However, there is a problem in that when the plurality of display modules are being installed in the rear space of the multi-display device, the work space of an operator of the multi-display device is needed in the rear space of the multi-display device, which means a large space is needed to install the multi-display device in the public place or the public facility.

BRIEF DESCRIPTION OF THE DRAWINGS

The above and other objects, features and other advantages of the present disclosure will be more clearly understood from the following detailed description taken in conjunction with the accompanying drawings, in which:

FIG. 1 is a perspective diagram schematically illustrating a state where a display has been installed in a display installation apparatus according to an embodiment of the present disclosure.

FIG. 2 is an exploded perspective diagram schematically illustrating a state where the display has been separated from the display installation apparatus according to an embodiment of the present disclosure.

FIG. 3 is an exploded perspective diagram schematically illustrating the display installation apparatus according to an embodiment of the present disclosure.

FIG. 4 is an exploded perspective diagram schematically illustrating a third position setting part in the display installation apparatus according to an embodiment of the present disclosure.

FIG. 5 is a cross-sectional diagram schematically illustrating a cross section obtained by cutting a region along line I-I' in FIG. 1.

FIGS. 6A and 6B are cross-sectional diagrams schematically illustrating a state where a third position movable part operates and the display is moved in the Z-axis direction in the display installation apparatus according to an embodiment of the present disclosure.

FIGS. 7A and 7B are cross-sectional diagrams schematically illustrating a state where a one-touch detaching and attaching part is operated in the display installation apparatus according to an embodiment of the present disclosure.

FIG. 8 is a perspective diagram schematically illustrating a multi-display according to an embodiment of the present disclosure.

FIG. 9 is a perspective diagram schematically illustrating a state where the display installation apparatus of the multi-display according to an embodiment of the present disclosure has been fastened to a guide rail.

FIG. 10 is a perspective diagram schematically illustrating a state where the display is installed in the display installation apparatus installed at the guide rail in the multi-display according to an embodiment of the present disclosure.

DESCRIPTION OF THE EMBODIMENTS

In order to facilitate understanding of the features of the present disclosure, a display installation apparatus and a multi-display including the same according to one or more embodiments of the present disclosure will be described in detail below.

It should be noted that, in order to facilitate understanding of the embodiments described below, in denoting the reference numerals to the components in each accompanying drawing, the same components are denoted by the same reference numerals as possible even though they are illustrated in different drawings. In addition, in the description of the present disclosure, a specific description of related known configurations or functions will be omitted when it is determined to obscure the subject matter of the present disclosure.

Hereinafter, one or more embodiments of the present disclosure will be described with reference to the accompanying drawings.

FIGS. 1 and 2 are perspective diagrams schematically illustrating the states where a display has been installed and separated in a display installation apparatus according to an embodiment of the present disclosure, FIG. 3 is an exploded perspective diagram schematically illustrating the display installation apparatus, and FIG. 4 is an exploded perspective diagram schematically illustrating a third position setting part in the display installation apparatus. All the components of the display and the display installation apparatus according to all embodiments of the present disclosure are operatively coupled and configured.

Further, FIG. 5 is a cross-sectional diagram schematically illustrating a cross section obtained by cutting a region along line I-I' in FIG. 1, FIGS. 6A and 6B are cross-sectional diagrams schematically illustrating a state where a third position movable part operates and the display is moved in the Z-axis direction in the display installation apparatus, and FIGS. 7A and 7B are cross-sectional diagrams schematically illustrating a state where a one-touch detaching and attaching part is operated in the display installation apparatus.

Referring to FIGS. 1 to 7, a display installation apparatus 100 according to an embodiment of the present disclosure can be fastened to a guide rail R installed at a wall or a frame, etc. to be slidably moved in a first direction that is the longitudinal direction of the guide rail R to be fixed to a desired position, to be slidably moved in a second direction that is the width direction of the guide rail R in a state where the first direction has been fixed in position to be fixed to a desired position, and to be moved in a third direction that is the forward of the guide rail R in a state where the second direction has been fixed in position to be fixed to a desired height.

For example, it is possible to adjust the interval between the displays positioned in the longitudinal direction of the guide rail R through the movement in the first direction, to adjust the interval between the displays positioned in the width direction of the guide rail R through the movement in the second direction, and to adjust the height with respect to the adjacent displays through the movement in the third direction.

More specifically, the display installation apparatus 100 includes a first position setting part 200 inserted into the guide rail R to be slidably moved in the first direction (e.g., Y-axis direction) that is the longitudinal direction of the guide rail R and selectively fixed in position, a second position setting part 300 positioned at the first position setting part 200 to be slidably moved in the second direction (e.g., X-axis direction) that is the width direction of the guide rail R and selectively fixed in position, a third position setting part 400 positioned at the second position setting part 300 to be moved in the third direction (e.g., Z-axis direction) that is the forward of the guide rail R and selectively fixed in position, and a fastening part 500 provided in a display 20 and detachably attached to the third position setting part 400 to install the display 20.

For example, the display installation apparatus 100 is configured so that the first position setting part 200 sets the position in the first direction that is the Y-axis direction in the drawing, the second position setting part 300 sets the position in the second direction that is the X-axis direction in the drawing, and the third position setting part 400 sets the position in the third direction that is the Z-axis direction in the drawing. Then, the fastening part 500 is provided in the display 20 and prepared so that the display 20 can be detachably attached to the third position setting part 400 in the one-touch manner.

For this purpose, the first position setting part 200 includes a first position setting part body 210 slidably moved on the guide rail R, a second directional rail 220 prepared at the first position setting part body 210 and for guiding the sliding movement of the guide rail R, and a first stopper 230 prepared at the first position setting part body 210 and for restricting the movement of the first position setting part body 210.

The first position setting part body 210 is prepared to have a rectangular block shape, has a guide slit formed at one side thereof and inserted into the guide rail R to be slidably moved, and has the second directional rail 220 installed at the other side surface thereof.

The second directional rail 220 is prepared at the other side surface of the first position setting part body 210, and guides so that the second position setting part 300 is inserted into the guide slit formed in the second direction and the second position setting part 300 slidably moves in the second direction that is the width direction of the guide rail R, that is, the X-axis direction in the drawing.

The first stopper 230 is fastened to both side surfaces of the first position setting part body 210 in the direction in which the first position setting part body 210 moves, and selectively in close contact with the guide rail R in a state that has been fastened to the first position setting part body 210 to restrict the movement of the first position setting part body 210.

For example, the first stopper 230 is prepared as a bolt and fastened to the side surface of the first position setting part body 210, and when the first position setting part body 210 moves on the guide rail R to be positioned at a desired position, the first stopper 230 is rotated to be in close contact with the guide rail R so that the first position setting part body 210 can be fixed in position to the guide rail R.

The second position setting part 300 includes a second position setting part body 310 slidably moved in the first position setting part 200, and a second stopper 320 prepared at the second position setting part body 310 and selectively in close contact with the first position setting part 200 to restrict the movement of the second position setting part body 310.

The second position setting part body 310 is prepared to have a rectangular block shape, has a guide slit formed at one side thereof and inserted into the second directional rail 220 provided at the first position setting part 200 to be slidably moved, and has the third position setting part 400 installed at the other side surface thereof.

The second stopper 320 is fastened to both side surfaces of the second position setting part body 310 in the direction in which the second position setting part body 310 moves, and selectively in close contact with the second directional rail 220 in a state that has been fastened to the second position setting part body 310 to restrict the movement of the second position setting part body 310.

For example, the second stopper 320 is prepared as a bolt and fastened to the side surface of the second position setting part body 310, and when the second position setting part body 310 moves on the second directional rail 220 to be positioned at a desired position, the second stopper 320 is rotated to be in close contact with the second directional rail 220 so that the second position setting part body 310 can be fixed in position to the second directional rail 220.

The third position setting part 400 includes a third position setting part body 410 into which the fastening part 500 is inserted, a third position guide part 420 protruded toward the front of the guide rail R from the second position setting part 300, and a third position movable part 430 rotatably fastened to the third position setting part body 410 and screw-fastened to the third position guide part.

More specifically, the third position setting part body 410 is prepared to have a tube shape with one side opened, and has the fastening part 500 inserted into and fastened to the opened one side thereof. Then, the third position setting portion body 410 includes a rotation supporting protrusion 411 for rotatably supporting the third position movable part 430 by being protruded to the outside from the closed other side surface thereof to pass through a fastening hole 431 of the third position movable part 430 and then having the end portion formed to extend to the outside of the radius direction from the inside of the third position movable part 430.

Herein, the rotation supporting protrusion 411 is prepared separately from the third position setting part body 410, and can be prepared to be inserted into the fastening hole 431 of the third position movable part 430 and then fastened to the third position setting part body 410.

The third position guide part 420 is prepared to have a cylindrical shape to be fastened to the second position setting part body 310 to be protruded in the third direction that is the forward of the guide rail R, that is, in the Z-axis direction in the drawing from the second position setting part 300, and formed with threads along the circumferential direction that is the circumference thereof.

The third position movable part 430 is rotatably fastened to the third position setting part body 410 through the rotation supporting protrusion 411 to be moved with the third position setting part body 410, and screw-fastened to the third position guide part 420, thereby linearly moving in the Z-axis direction upon the rotation. For example, the third position setting part body 410 can be moved in the Z-axis direction, thereby adjusting the height of the display 20.

For example, as illustrated in FIG. 6A, when the third position movable part 430 is rotated in a first direction (e.g., a curved arrow direction in FIG. 6A), the third position movable part 430 can move in the direction inserted into the third position guide part 420 to move so that the display 20 is inserted in the Z-axis direction.

Then, as illustrated in FIG. 6B, when the third position movable part 430 is rotated in a second direction (e.g., a curved arrow direction in FIG. 6B), the third position movable part 430 can move in the direction protruded from the third position guide part 420 to move so that the display 20 is protruded in the Z-axis direction.

Therefore, it is possible to adjust the display to be installed with the adjacent display where the installation has been completed in height.

Herein, the third position movable part 430 has the outer circumferential surface prepared to have a polygonal shape and is prepared so that the user can adjust the height of the display 20 by rotating it more easily by using a hand or a tool.

The third position setting part 400 can further provide a washer 440 between the third position setting part body 410 and the third position movable part 430 in order to easily rotate the third position movable part 430 by reducing the frictional force between the third position setting part body 410 and the third position movable part 430.

Furthermore, the third position setting part 400 further includes a one-touch detaching and attaching part 450 prepared in the one-touch manner, which is positioned at the opened inside of the third position setting part body 410, fixes the fastening part 500 by the magnetic force when the fastening part 500 is inserted therein, generates the compression elastic force when pressurized in the direction into which the fastening part 500 is inserted after fixing, and releases the fastening part 500 by the elastic force when the pressurizing force is removed. Herein, the fastening part 500 should be fastened to the one-touch detaching and attaching part 450 by the magnetic force, and thus the fastening part 500 is prepared by metal material.

According to such a configuration, when the fastening part 500 is inserted into the third position setting part 400, the fastening part 500 is fastened by the magnetic force, and when the fastening part 500 is pressurized for detaching therefrom, the fastening part 500 is released by the elastic force, such that the display 20 can be easily detached from and attached to the third position setting part 400 in the one-touch manner.

More specifically, the one-touch detaching and attaching part 450 includes a plate 451 inserted into the opened inside of the third position setting part body 410, an elastic member 452 having one side end fastened to the plate 451 and having the other side end fastened to the third position setting part body 410, and a permanent magnet 453 prepared in a pair to be positioned at the plate 451 to be spaced at a certain interval apart from each other, and for generating the magnetic force.

According to such a configuration, when the fastening part 500 is inserted into the third position setting part body 410, the fastening part 500 is fixed in position in a state that has been attached to the permanent magnet 453 and inserted into the third position setting part body 410.

In the case that the fastening part 500 is detached from the third position setting part body 410, as illustrated in FIG. 7A, when the fastening portion 500 is pressurized, the elastic member 452 is pressurized to generate the compression elastic force, and when the pressurizing force for pressurizing the fastening part 500 is removed, the fastening part 500 moves to its original position by the elastic force of the elastic member 452. At this time, the inertial force generated while the fastening part 500 returns to its original position is greater than the attaching force between the fastening part 500 and the permanent magnet 453, such that as illustrated in FIG. 7B, the fastening part 500 is separated from the permanent magnet 453.

In this case, the fastening part 500 is preferably positioned in a state that has not been completely separated from the third position setting part body 410 and partially inserted therein. For example, when the fastening part 500 is completely separated from the third position setting part body 410, the display can be dropped, and thus it is protruded to the extent of forming the gap with the adjacent displays in the height direction to move by the extent that the user can grip and separate the display therefrom.

Furthermore, the guide rail R are prepared in a pair to be positioned in parallel, a plurality of first position setting parts 200 are positioned on each of the guide rails R, the third position setting part 400 is positioned at the second position setting part 300 positioned at each of the first position setting parts 200, respectively, and the fastening part 500 fastened at each of the third position setting parts 400 is provided in one display.

For example, as illustrated in FIGS. 1 and 2, when the first position setting part 200, the second position setting part 300, and the third position setting part 400 are prepared with four, two can be positioned on one guide rail R to be positioned to have a two-columns and two-rows form. Further, the fastening part 500 can also be prepared with four to be fastened to four corners of the display 20, respectively to be installed at the third position setting part 400, thereby supporting the display 20 more stably.

At this time, the interval between the third position setting parts 400 can be previously set and fixed in order to be the same as the position of the fastening part 500 fastened to the display 20 for setting and installing the position more easily.

For this purpose, the present disclosure further includes a first connecting bar 460 for connecting between the third position setting parts 400 adjacent to each other in the first direction and a second connecting bar 470 for connecting between the third position setting parts 400 adjacent to each other in the second direction.

Therefore, since the four third position setting parts 400 are connected to each other by the first connecting bar 460 and the second connecting bar 470, the four third position setting parts 400 can move together in the first direction, the second direction, and the third direction, thereby setting the position of the display 20 more easily.

FIG. 8 is a perspective diagram schematically illustrating a multi-display according to an embodiment of the present disclosure, FIG. 9 is a perspective diagram schematically illustrating a state where the display installation apparatus of the multi-display has been fastened to the guide rail, and FIG. 10 is a perspective diagram schematically illustrating a state where the display is installed in the display installation apparatus installed on the guide rail.

Referring to FIGS. 8 to 10, a multi-display 10 according to an embodiment of the present disclosure includes the plurality of displays 20, and the display installation apparatus 100 movably positioned on the guide rail R and installed with each of the plurality of displays 20 to move the display 20 to set the position. For example, since the plurality of displays 20 are installed on the guide rail R through the display installation apparatus 100, each of the displays 20 can be easily adjusted in interval and height with adjacent displays through the display installation apparatus 100.

Herein, the guide rail R is fastened and fixed to the wall surface of the installation place or the frame of the structure, etc. The display 20 can be prepared even in any form capable of displaying an image, such as an organic emitting display panel.

The multi-display 10 can be fastened in the one-touch manner by installing the plurality of display installation apparatuses 100 on the guide rail R to fix their positions and then inserting the display 20 into each of the display installation apparatus 100.

Since the display installation apparatus 100 of FIGS. 8-10 has been described above with reference to FIGS. 1 to 7, a detailed description thereof will be omitted or will be brief.

Describing the installation sequence of the multi-display 10 of the present disclosure prepared by such a configuration, as illustrated in FIG. 9, the plurality of display installation apparatuses 100 are installed and fixed in position on the guide rail R (or guide rails R's). At this time, the display installation apparatus 100 is preferably fixed at an interval that does not collide with the adjacent displays 20 when the display 20 is installed therein.

Then, it is possible to install the display 20 in any one of the display installation apparatuses 100 to fix in position at the desired position and height, and then as illustrated in FIG. 10, to install the display 20 in the adjacent display installation apparatus 100 and then be in close contact therewith in order not to form the gap with the previously installed display 20, and to fix in position by adjusting the height in order to have the same height.

When any one display of the plurality of displays needs to be replaced due to a failure or breakage during the use after the multi-display has been completed to install, the display can be lifted at a certain height when pressing the display that needs to be replaced in the one-touch manner, thereby easily replacing the display without the interference with other displays. In addition, since the display installation apparatus has been fixed in position, the additional position adjustment is not needed when a new display is inserted therein and fastened thereto, such that maintenance and repair become simple and convenient.

According to the display installation apparatus and the multi-display including the same according to the present disclosure, it is possible to perform the installation and disassembly works of the display within the front space of the display, thereby improving the convenience and the speed of the installation work of the operator.

Further, according to the present disclosure, it is possible to perform the installation and disassembly works of the display within the front space of the display, thereby easily installing the multi-display even in the narrow space without the space for the rear work of the multi-display.

In addition, according to the present disclosure, it is possible to detach and attach the display in the one-touch manner in the display installation apparatus, thereby improving the convenience and the speed of the installation and replacement works of the display.

Furthermore, according to the present disclosure, it is possible to easily adjust the gap in various directions (e.g., one or more of the X, Y, and Z-axes directions) between the displays, thereby minimizing the gap between the displays and improving the display quality of the display.

As described above, although the present disclosure has been described with reference to the limited embodiments and drawings, it should be understood that the present disclosure is not limited thereto and various modifications and deformations can be made by those skilled in the art to which the present disclosure pertains within the technical spirit of the present disclosure and the equivalent scope of the appended claims.

The invention claimed is:

1. A display installation apparatus, comprising:
a first position setting part coupled to a guide rail to be slidably moved in a first direction that is a longitudinal direction of the guide rail, the first position setting part selectively fixed in a first position in the first direction;
a second position setting part positioned at the first position setting part to be slidably moved in a second direction that is a width direction of the guide rail, the second position setting part selectively fixed in a second position in the second direction;
a third position setting part positioned at the second position setting part to be moved in a third direction that is a forward direction of the guide rail, the third position setting part selectively fixed in a third position in the third direction; and
a fastening part, which is provided for a display and detachably attached to the third position setting part to install the display into the display installation apparatus,
wherein the third direction is perpendicular to the first direction and the second direction, and
wherein the third position setting part comprises:
a third position setting part body with the fastening part inserted therein;
a third position guide part which protrudes toward the third direction from the second position setting part; and
a third position movable part which is rotatably fastened to the third position setting part body and screw-fastened to the third position guide part.

2. The display installation apparatus according to claim 1, wherein the first position setting part comprises:
a first position setting part body slidably moved on the guide rail;
a second directional rail arranged at the first position setting part body, and configured to guide the second position setting part; and
a first stopper arranged at the first position setting part body, and configured to restrict a movement of the first position setting part body.

3. The display installation apparatus according to claim 2, wherein the first position setting part body has a rectangular block shape, one side of the first position setting part body is formed with a guide slit, and the second directional rail is formed at a surface of another side of the first position setting part body.

4. The display installation apparatus according to claim 2, wherein the first stopper is provided at side surfaces of the first position setting part body in the first direction, and is in close contact with the guide rail to restrict the movement of the first position setting part body.

5. The display installation apparatus according to claim 4, wherein the first stopper includes a bolt.

6. The display installation apparatus according to claim 2, wherein the second position setting part comprises:
a second position setting part body slidably moved in the first position setting part; and
a second stopper arranged at the second position setting part body, and configured to restrict a movement of the second position setting part body.

7. The display installation apparatus according to claim 6, wherein the second position setting part body has a rectangular block shape, one side of the second position setting part body is formed with a guide slit to be coupled to the second directional rail, and a surface of another side of the second position setting part body is installed with the third position setting part.

8. The display installation apparatus according to claim 6, wherein the second stopper is provided at side surfaces of the second position setting part body in the second direction, and is in close contact with the second directional rail to restrict the movement of the second position setting part body.

9. The display installation apparatus according to claim 8, wherein the second stopper includes a bolt.

10. The display installation apparatus according to claim 1, wherein the third position setting part body has a tube shape with one side opened, and the fastening part is inserted and fastened to the opened side of the third position setting part body.

11. The display installation apparatus according to claim 10, wherein the third position setting part further comprises:
a one-touch detaching and attaching part provided in the opened side of the third position setting part body.

12. The display installation apparatus according to claim 11, wherein the one-touch detaching and attaching part fixes the fastening part by magnetic force when the fastening part is inserted in the third position setting part body, generates compression elastic force when pressurized in a direction in which the fastened part has been inserted therein after fixing, and releases the fastening part by elastic force when the pressurizing force is removed.

13. The display installation apparatus according to claim 11, wherein the one-touch detaching and attaching part comprises:
a plate inserted into the opened side of the third position setting part body;
an elastic member with one side end fastened to the plate and another side end fastened to the third position setting part body; and
a permanent magnet, arranged in pair at the plate and spaced at a certain interval apart from each other, for generating magnetic force.

14. The display installation apparatus according to claim 1, wherein the third position setting part body comprises a rotation supporting protrusion, which protrudes to outside from a surface of the closed other side of the third position setting part body to pass through a fastening hole of the third position movable part, and an end portion thereof is formed to extend to outside of a radius direction from inside of the third position movable part.

15. The display installation apparatus according to claim 14, wherein the rotation supporting protrusion is arranged to be inserted into the fastening hole and be fastened to the third position setting part body.

16. The display installation apparatus according to claim 1, wherein the third position guide part has a cylindrical shape and is formed with threads along a circumferential direction thereof.

17. The display installation apparatus according to claim 1, wherein the third position setting part further comprises a washer provided between the third position setting part body and the third position movable part.

18. The display installation apparatus according to claim 1, wherein the third position movable part has an outer circumferential surface arranged to have a polygonal shape.

19. The display installation apparatus according to claim 1, wherein the guide rail is prepared in a pair to be positioned in parallel, a plurality of first position setting parts are positioned on each of the guide rails, each third position setting part is positioned at each second position setting part positioned at each of the first position setting parts, respectively, and the fastening part fastened at each of the third position setting parts is provided in one display.

20. The display installation apparatus according to claim 1, further comprising:
a first connecting bar, with one end portion positioned on the third position setting part, and configured to connect to a third position setting part of another display installation apparatus in the first direction; and
a second connecting bar, with one end portion positioned on the third position setting part, and configured to connect to a third position setting part of another display installation apparatus in the second direction.

21. A multi-display, comprising:
a plurality of displays; and
a plurality of display installation apparatuses for installing the plurality of displays, each of the display installation apparatuses being the display installation apparatus according to claim 1 and being movably positioned on the guide rail.

* * * * *